United States Patent [19]

Wechsung et al.

[11] 4,085,022

[45] Apr. 18, 1978

[54] METHOD AND APPARATUS FOR CONTROLLING THE REMOVAL, BY MEANS OF ION ETCHING, OF A THIN LAYER FROM A SUBSTRATE

[75] Inventors: Reiner Wechsung, Cologne; Jürgen Kirschner, Aachen, both of Germany

[73] Assignee: Leybold-Heraeus GmbH & Co. Kommandit-Gesellschaft, Cologne, Germany

[21] Appl. No.: 763,689

[22] Filed: Jan. 28, 1977

[30] Foreign Application Priority Data

Jan. 31, 1976 Germany .............................. 2603675

[51] Int. Cl.² .............................................. C23C 15/00
[52] U.S. Cl. ................................ 204/192 E; 156/643;
219/121 EM; 219/121 P; 204/298
[58] Field of Search ............... 204/192 R, 192 E, 298;
156/643; 219/121 EM, 121 P

[56] References Cited

U.S. PATENT DOCUMENTS

| 3,528,387 | 9/1970 | Hamilton | 118/49.1 |
| 3,664,942 | 5/1972 | Havas et al. | 204/192 E |

OTHER PUBLICATIONS

D. J. Barber, "Thin Foils of Non-Metals Made for Electron Microscopy by Sputter-Etching," *J. Mat. Sci.*, vol. 5, (pp. 1–8), (1970).

*Primary Examiner*—Aaron Weisstuch
*Attorney, Agent, or Firm*—Spencer & Kaye

[57] ABSTRACT

A method for controlling the removal, by means of ion etching, of a thin layer or regions of the layer as determined by masks, from a substrate of a sample which has a chemical composition different than that of the layer to be removed. During the ion etching process, an electrical signal which changes after the removal of the thin layer is derived from the substrate or from its mount, or from an electrode disposed in the vicinity of said substrate and this electrical signal is utilized to control an arrangement which influences the ion bombardment of the surface of the sample.

8 Claims, 2 Drawing Figures

METHOD AND APPARATUS FOR CONTROLLING THE REMOVAL, BY MEANS OF ION ETCHING, OF A THIN LAYER FROM A SUBSTRATE

BACKGROUND OF THE INVENTION

The present invention relates to a method for controlling the removal, by means of ion etching, of a thin layer, or regions of a layer as determined by masks, from a substrate which has a different chemical composition than that of the layer to be removed. The invention further relates to a suitable apparatus for practicing this method.

In the process of ion etching, the effect of cathode sputtering is utilized for the directed removal of surface layers, i.e., the layer regions to be removed are sputtered by ion bombardment and are thus removed. The ions may be generated, for example, in an ion source and then accelerated in the direction of the sample. Ion etching for the directed removal of surfaces (ion polishing and ion milling) produces a depth resolution in the atomic region and is used, inter alia, for the removal of surface adhering impurities. For example, an oxide film of a typical thickness of 100 Angstroms can be removed from a sample with minimum stress and destruction of The sample by an ion etching process.

The periodical "Vakuumtechnik", Volume 24, Issue No. 6, September 1975, describes the removal by ion etching of certain layer regions which are defined by masks on a layer which is applied to a substrate and whose thickness lies, for example, in the micron range. The substrate may also be a second layer of material of a multi-layer sample which can be further removed in sections by means of a further etching process in the regions in which the upper layer has already been removed. The use of this etching technique is particularly appropriate in the manufacture of microelectronic components.

In most cases of use of the ion etching process there results the problems of being able to accurately control the ion etching process, particularly the etching depth, in order, for example, to terminate the ion etching process when a certain boundary layer of a multi-layer system has been reached. If, for example, a resistor or conductor structure in an integrated circuit is to be produced by means of ion etching, it may be desirable to terminate the ion etching process precisely when a clean substrate surface has been reached in order to prevent damage to the substrate or the remaining surface structures. Since any type of material may be removed in the ion etching process there often arises the problem of stability of the masks. Since the masks are removed particularly easily along their edges if the ion bombardment takes place at an acute angle, there exists the danger that the masks will shrink if the ion etching process continues for too long a period of time so that the desired structure can no longer be obtained.

The precise determination of the etching depth has been difficult to accomplish in the prior art ion etching systems. Optical controls are usually insufficient or even often impossible due to the structure of the apparatus. Analysis processes, for example with the aid of electron spectroscopy or mass spectroscopy, are complicated and expensive and are generally combined with an ion etching system only in research plants.

SUMMARY OF THE INVENTION

It is the object of the present invention to provide a process for controlling the removal, by means of ion etching, of a thin layer or of regions of a thin layer as determined by masks, from a substrate which has a different chemical composition than the layer, which process permits, in the simplest manner, an accurate control of the ion etching process.

This is accomplished according to the present invention in that during the ion etching process an electrical signal, which changes upon removal of the thin surface layer of the sample, is derived from the substrate (or from its mount) or from an electrode disposed in the vicinity of the sample, and this electrical signal is used to control a device which influences or interrupts the ion bombardment. If ions are shot, for example, onto the sample from an ion source, a change in the easily measured sample current can be utilized as a signal for actuating the regulating process.

The reason for the change in the sample current after removal of the first or suface layer is as follows: the sample current is composed of a constant portion of the incident ion current and a surface specific portion which is produced by the release of secondary electrons, secondary ions and back-scattering of incident ions. Since generally the secondary electron coefficient is very high as compared to the secondary ion coefficient and to the ion back-scatter coefficient, the surface specific proportion of the sample current is determined predominantly by the secondary electron current. With constant energy and mass of the incident ions, the release of secondary electrons is dependent only on the surface composition of the sample under bombardment. The number of electrons released per incident ion is different from element to element and can be utilized to characterize the surface. Thus, if during ion etching of a system of a plurality of superposed layers, the boundary surface of a new element is reached, thus indicating that the original surface layer has been removed, the measured sample current changes by the amount of the change in the secondary electron current as a result of the change in the secondary electron coefficient. The sample current is here advisably measured in that the sample including its mount are electrically insulatedly suspended with respect to the surrounding members so that a current measuring instrument can be connected to the sample and mount and the sample current flowing therethrough can be measured in a simple manner.

The steep edges of the sample current-time curve when a new boundary layer is reached are so distinct that they can be used very easily to actuate a regulating process. A prerequisite for a steep change in the sample current is, however, uniform removal of the structure to be removed which can only be accomplished with an ion beam having a uniform current density. This uniformity of the current density, however, can be accomplished without difficulty, for example, with the aid of external ion sources.

Another possibility of determining when the boundary surface of a new element has been reached is to use an electrode positioned adjacent the sample to collect the secondary electrons emitted by the ions to measure the secondary electron current and to use the changes in this current to control the device which influences the ion bombardment. This likewise provides, in an analogous manner, sensitive control over the ion bombardment.

DETAILED DESCRIPTION OF THE PREFERRED EMBODIMENTS

Figure 1:
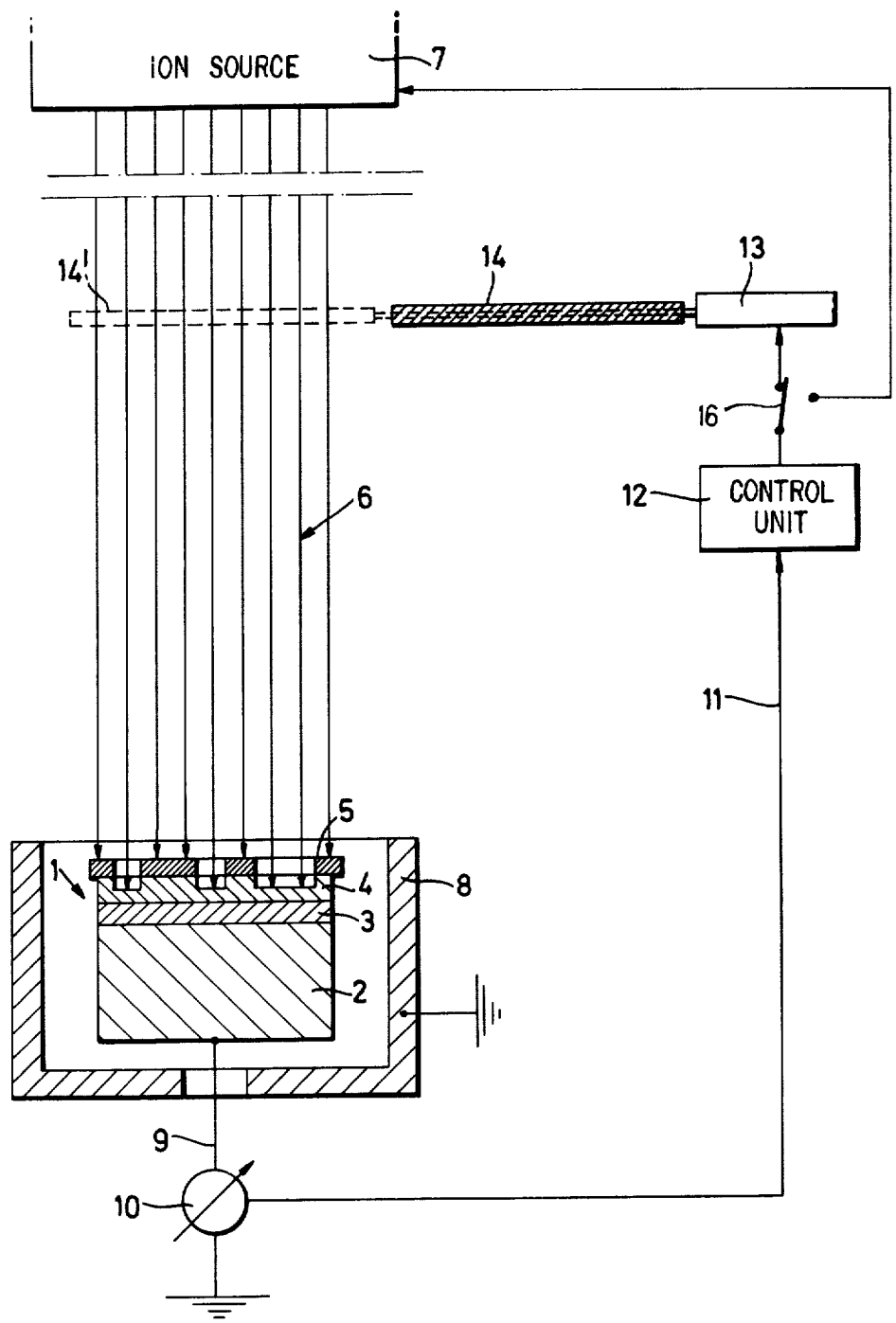
FIG. 1 is a schematic illustration of one embodiment of an apparatus according to the present invention.

Referring now to FIG. 1, there is shown a sample 1 including a substrate 2 having two layers 3 and 4 applied thereon with at least the layers 3 and 4 being formed of different materials. Above sample 1 there is a mask 5 which permits the ion beam 6 to pass only to those surface areas of layer 4 which are to be removed by the ion etching process. The sample 1, including any mount (not shown) therefore is electrically isolatedly mounted with respect to ground.

The ion beam 6 is generated, in a known manner, in an ion source 7, which is indicated schematically, and is accelerated in a likewise known manner (not shown in detail) in the direction toward sample 1 with a beam profile which is as uniform as possible.

When the ion beam impinges on the surface of the layer 4 of sample 1, secondary electrons are produced which leave the surface and influence the magnitude of the sample current in dependence on the particular material being removed. In order to shield the sample 1 from its environment, a grounded can electrode, which is electrically insulatedly mounted with respect to the sample 1 and any mount therefor, is provided.

In order to measure sample current flowing to ground during the ion etching process, the sample 1, or possibly its mount, is connected with a current measuring instrument 10 via a line 9. The electrical signal emitted by the measuring instrument 10 is conducted through a line 11 and fed to a control unit 12. This control unit 12 controls the schematically illustrated moving mechanism 13, which may for example, be a solenoid of a displaceable shutter 14. The shutter 14 is shown in its normal position in which it permits the ion beam 6 to pass to the surface of the sample 1. Upon actuation of the moving mechanism 13 the shutter 14 can be brought into the position 14' shown in dashed lines in which it prevents impingement of the ion beam 6 on sample 1.

During the ion etching process, the desired layer regions of layer 4 are initially removed with a constant ion current as produced by the ion beam 6. The sample current measured by measuring instrument 10 is constant during this time. When layer 3, is reached, i.e., when the desired regions of layer 4 have been removed this measured sample current changes, although the ion current 6 does not change, since a change in material changes the current component generated by the creation of secondary electrons. This change in the sample current is detected by control unit 12 which causes the moving mechanism to bring the moving shutter 14 into the position 14' shown in dashed lines so that the ion etching process of the sample 1 is interrupted. Instead of actuating the shutter 14 via the mechanism 13, the output signal of control unit 12 can be fed, if desired to the ion source 7, e.g., by changing the position of switch 16, to interrupt the ion current itself in that the ion source 7 itself or the acceleration voltage of the ion source 7 is turned off. During the time the ion beam 6 is interrupted, the mask 5 can be changed, for example.

Figure 2:
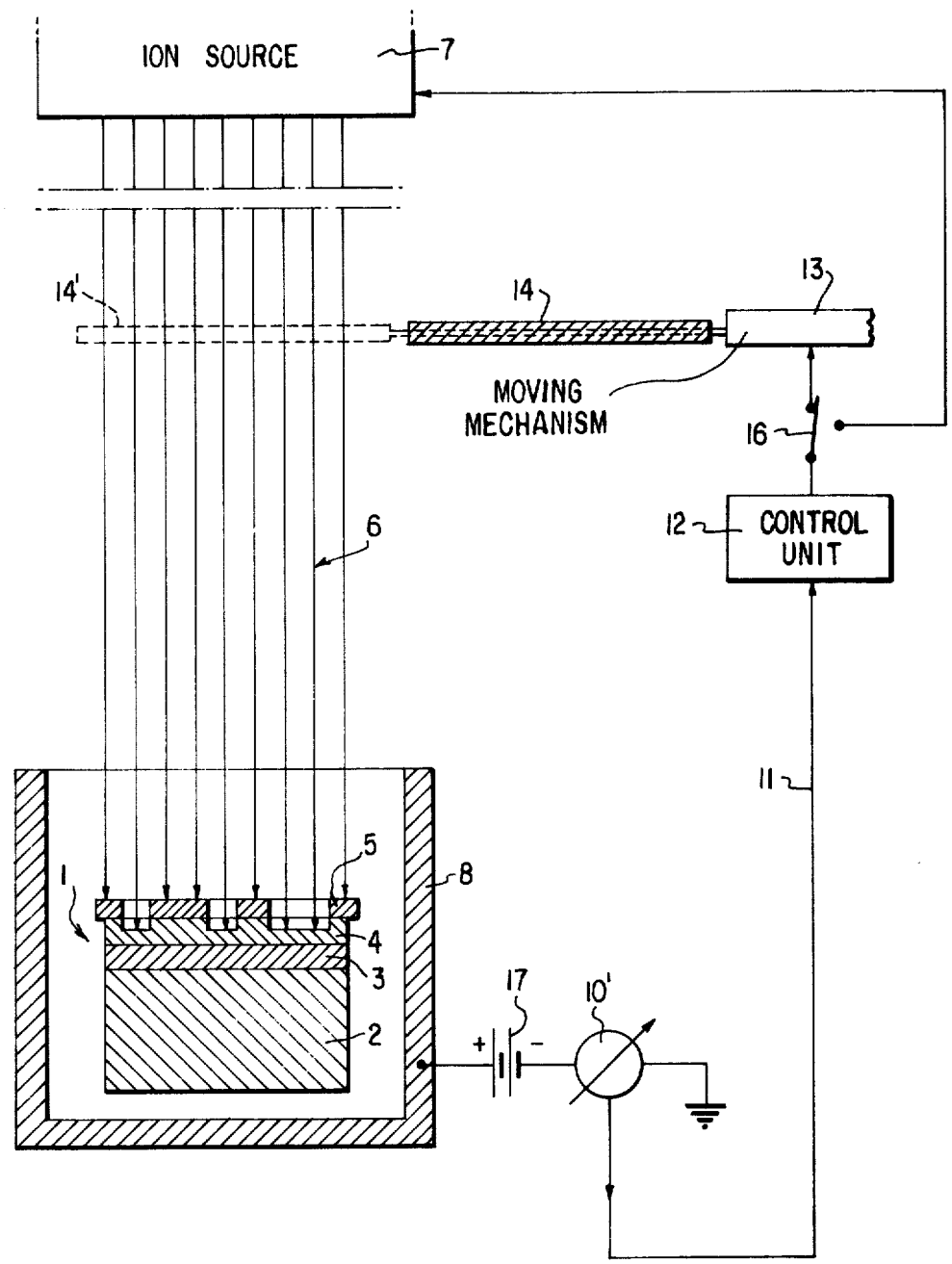
FIG. 2 is a schematic illustration of a modification of the apparatus of FIG. 1.

If only the secondary electron current is to be used to control the ion bombardment, then, as shown in FIG. 2 the can electrode 8, which for such purposes is advantageously designed somewhat longer (in the direction of ion source 7), is provided with a slight positive bias (10 to 100 V) as shown by the battery 17 so that it acts as a collector for the secondary electrons. The measuring device 10' in this case is connected to the electrode 8. The secondary electron current is used to control the ion bombardment in a manner analogous to that described with respect to FIG. 1.

A significant advantage of the present invention is furthermore that even older ion etching systems can be easily modified so that the present invention can be used with them. The only thing required is to electrically insulate the sample and/or its mount so that the sample current, or in some cases the sample voltage, can be measured with a simple measuring instrument.

The present invention can also be used independently of the material of the layer to be removed, i.e., for all materials which can be removed by ion etching, and thus in particular for conductors and semiconductors.

As a practical example of the referenced invention, ion etching of the metallisation of integrated circuits shall be explained. The particular problem in that case consists in etching a metallisation layer of gold with chromium as an intermediate adhesion layer without damaging the substrate, which should have an insulating surface in this example. The typical sequence of layers is: substrate, 500 Angstrom chromium, 10,000 Angstrom gold. If for ion etching an ion current density of 1 $mA/cm^2$ is used for a substrate of 1 $\times$ 1 inch, current of 10mA is resultant at electrode 2 while the gold layer is being etched; at transition to the chromium layer the current increases to 14mA, and at transition to the substrate it falls back to zero. If only the secondary electron current at electrode 8 is measured, it amounts in this example to 3.5mA for the gold layer, 7.5mA for the chromium layer and approaches zero at transition to the substrate.

The shutter 14 may be closed or the ion source may be shut off when the current at electrode 2 has fallen below 3mA or at electrode 8 below 1mA.

It will be understood that the above description of the present invention is susceptible to various modifications, changes and adaptations, and the same are intended to be comprehended within the meaning and range of equivalents of the appended claims.

What is claimed is:

1. A method of removing a thin surface layer, or regions of the thin layer as determined by masks, from a substrate of a sample, which substrate has a chemical composition different from that of said layer, by an ion etching process including: mounting the sample to be etched in an electrically insulated manner; bombarding the surface of the layer to be removed with an ion beam of substantially uniform current density generated in an ion source; and controlling the removal of the layer or regions thereof by measuring the sample current, which is composed of the ion current and further surface specific components, during the ion etching process to derive an electrical signal which changes after the removal of said layer from the substrate, and interrupting the ion bombardment of the sample surface by the ions from the ion source upon a change in the measured sample current.

2. A method of removing a thin surface layer, or regions of the thin layer as determined by masks, from a substrate of a sample, which substrate has a chemical composition different from that of said layer, by an ion etching process including: mounting the sample to be etched in an electrically insulated manner; bombarding the surface of the layer to be removed with an ion beam of substantially uniform current density produced in an ion source; and, controlling the removal of the layer, or regions thereof, by collecting the secondary electrons generated by the ions during the ion etching process by means of an electrode disposed in the vicinity of said sample, measuring the secondary electron current to derive an electrical signal which changes after the removal of said layer from the substrate, and interrupting the ion bombardment of the sample by the ions from the ion source upon a change in the measured secondary electron current.

3. Apparatus for removing a thin surface layer, or regions of the thin layer as determined by masks, from a substrate of a sample, which substrate has a chemical composition different from that of said layer, by an ion etching process comprising in combination: means for mounting said sample in an electrically insulated manner; an ion source means for generating a beam of ions of substantially uniform current density and for bombarding the surface of said layer of said sample to be removed with said ion beam; a current measuring means comnnected to said sample for measuring the sample current, which is composed of the ion current and further surface specific components, during the ion etching process; and means connected to said current measuring means and responsive to the measured current for interrupting the bombardment of the surface of the sample by said ion beam produced by said ion source upon a change in the measured current, which change indicates the removal of said layer.

4. The apparatus defined in claim 3 wherein said means for interrupting includes a shutter which is selectively displaceable into the path of said ion beam to block same, and a control means for displacing said shutter into the path of said ion beam upon a change in the measured sample current.

5. The apparatus defined in claim 3 wherein said means for interrupting includes means electrically connected to said ion source for electrically interrupting the ion beam.

6. Apparatus for removing a thin surface layer, or regions of the thin layer as determined by masks, from a substrate of a sample which substrate has a chemical composition different from that of said layer by an ion etching process comprising in combination: means for mounting said sample in an electrically insulated manner; an ion source means for generating an ion beam of substantially uniform current density and for bombarding the surface of said layer of said sample to be removed with said ion beam; can-shaped electrode means enclosing said sample for collecting the secondary electrons generated by the ions; means connected to said electrode for measuring the secondary electron current during the ion etching process; and means, connected to said means for measuring the responsive to a change in the measured secondary electron current, for interrupting the bombardment of the sample by said ion beam.

7. Apparatus as defined in claim 6 wherein said means for interrupting includes a shutter which is selectively displaceable into the path of said ion beam to block same, and a control means for displacing said shutter into the path of said ion beam upon a change in the measured secondary electron current.

8. Apparatus as defined in claim 6 wherein said means for interrupting includes means electrically connected to said ion source for electrically interrupting the ion beam.

* * * * *